(12) United States Patent
Miyoshi

(10) Patent No.: US 12,183,861 B2
(45) Date of Patent: Dec. 31, 2024

(54) LIGHT-EMITTING DEVICE

(71) Applicant: NICHIA CORPORATION, Anan (JP)

(72) Inventor: Tomonori Miyoshi, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 18/522,392

(22) Filed: Nov. 29, 2023

(65) Prior Publication Data

US 2024/0097082 A1 Mar. 21, 2024

Related U.S. Application Data

(63) Continuation of application No. 17/499,362, filed on Oct. 12, 2021, now Pat. No. 11,870,017, which is a
(Continued)

(30) Foreign Application Priority Data

Sep. 29, 2017 (JP) .................................. 2017-191476

(51) Int. Cl.
*H01L 33/50* (2010.01)
*F21S 41/141* (2018.01)
(Continued)

(52) U.S. Cl.
CPC ........ *H01L 33/505* (2013.01); *H01L 25/0753* (2013.01); *H01L 27/153* (2013.01);
(Continued)

(58) Field of Classification Search
CPC .............................. H01L 25/167; F21S 41/141
See application file for complete search history.

(56) References Cited

U.S. PATENT DOCUMENTS

2008/0272712 A1 11/2008 Jalink et al.
2009/0159912 A1 6/2009 Engl et al.
(Continued)

FOREIGN PATENT DOCUMENTS

JP 2009-526377 A 7/2009
JP 2010-219324 A 9/2010
(Continued)

OTHER PUBLICATIONS

Final Office Action in U.S. Appl. No. 16/143,363 dated Feb. 21, 2020.
(Continued)

*Primary Examiner* — Antonio B Crite
(74) *Attorney, Agent, or Firm* — Foley & Lardner LLP

(57) ABSTRACT

A light-emitting device includes: a substrate having an upper surface; at least one light-emitting element on or above the substrate, the at least one light-emitting element having a rectangular shape in a plan view from above the light-emitting device and having an upper surface serving as a light-emitting surface of the at least one light-emitting element; a plate-shaped light-transmissive member having a rectangular shape in a plan view from above the light-emitting device and having a lower surface that faces the upper surface of the at least one light-emitting element; and a light-guiding member that is disposed between the light-emitting element and the light-transmissive member.

8 Claims, 6 Drawing Sheets

Related U.S. Application Data continuation of application No. 16/939,937, filed on Jul. 27, 2020, now Pat. No. 11,195,979, which is a continuation of application No. 16/143,363, filed on Sep. 26, 2018, now Pat. No. 10,770,630.

(51) Int. Cl.
| | | |
|---|---|---|
| H01L 25/075 | (2006.01) | |
| H01L 27/15 | (2006.01) | |
| H01L 33/54 | (2010.01) | |
| H01L 33/58 | (2010.01) | |
| H01L 33/62 | (2010.01) | |
| H01L 33/44 | (2010.01) | |
| H01L 33/60 | (2010.01) | |

(52) U.S. Cl.
CPC .............. *H01L 33/54* (2013.01); *H01L 33/58* (2013.01); *F21S 41/141* (2018.01); *H01L 33/60* (2013.01); *H01L 33/62* (2013.01)

(56) References Cited

U.S. PATENT DOCUMENTS

| | | |
|---|---|---|
| 2013/0329440 A1 | 12/2013 | Tsutsumi et al. |
| 2015/0340574 A1 | 11/2015 | Tamaki |
| 2016/0118548 A1 | 4/2016 | Kawaguchi et al. |
| 2016/0240746 A1* | 8/2016 | Yun .................... H01L 33/56 |
| 2016/0247787 A1 | 8/2016 | Chen et al. |
| 2016/0300821 A1 | 10/2016 | Chen et al. |
| 2017/0155022 A1 | 6/2017 | Tomonari et al. |
| 2017/0248281 A1 | 8/2017 | Ozeki |
| 2017/0345978 A1 | 11/2017 | Tamaki |
| 2017/0365746 A1 | 12/2017 | Vampola et al. |
| 2019/0207071 A1 | 7/2019 | Grötsch |

FOREIGN PATENT DOCUMENTS

| | | |
|---|---|---|
| JP | 2012-169189 A | 9/2012 |
| JP | 2013-089769 A | 5/2013 |
| JP | 2013-110199 A | 6/2013 |
| JP | 2015-076455 A | 4/2015 |
| JP | 2015-220446 A | 12/2015 |
| JP | 2016-028461 A | 2/2016 |
| JP | 2016-086166 A | 5/2016 |
| JP | 2016-157922 A | 9/2016 |
| JP | 2017-108091 A | 6/2017 |
| WO | WO-2007/034367 A1 | 3/2007 |
| WO | WO-2010/143114 A1 | 12/2010 |
| WO | WO-2014/076610 A1 | 5/2014 |

OTHER PUBLICATIONS

Non-Final Office Action in U.S. Appl. No. 16/143,363 dated Aug. 16, 2019.
Non-Final Office Action in U.S. Appl. No. 16/939,937 dated Sep. 25, 2020.
Non-Final Office Action in U.S. Appl. No. 17/499,362 dated Mar. 13, 2023.
Notice of Allowance in U.S. Appl. No. 16/143,363 dated Apr. 28, 2020.
Notice of Allowance in U.S. Appl. No. 16/939,937 dated Jul. 14, 2021.
Notice of Allowance in U.S. Appl. No. 17/499,362 dated Aug. 30, 2023.
US Office Action in U.S. Appl. No. 16/939,937 dated Apr. 16, 2021.

* cited by examiner

LIGHT-EMITTING DEVICE

CROSS-REFERENCE TO RELATED APPLICATIONS

The present application is a continuation of U.S. patent application Ser. No. 17/499,362, filed on Oct. 12, 2021, which is a continuation of U.S. patent application Ser. No. 16/939,937, filed on Jul. 27, 2020, now U.S. Pat. No. 11,195,979, which is a continuation of U.S. patent application Ser. No. 16/143,363, filed on Sep. 26, 2018, now U.S. Pat. No. 10,770,630, which claims priority to Japanese Patent Application No. 2017-191476, filed on Sep. 29, 2017. The disclosures of these applications are hereby incorporated by reference in their entireties.

BACKGROUND

The present disclosure relates to a light-emitting device, and more particularly, to a light-emitting device for a headlight.

Semiconductor light-emitting elements, such as light-emitting diodes and laser diodes, have been brought into use as various light sources, and in recent years particularly, as light sources for vehicle headlights. These light sources for vehicle headlights are required to show, for example, a specific light distribution called a Lambertian light distribution, in addition to high luminance. As a light-emitting device suitable for a headlight, Japanese Patent Publication No. 2015-76455 discloses a light-emitting device that includes semiconductor light-emitting elements disposed on or above the surface of a substrate, a light-reflective frame enclosing the semiconductor light-emitting elements on or above the substrate, and a transparent phosphor layer covering the upper and lateral surfaces of the semiconductor light-emitting elements. This light-emitting device emits light in one direction from the opening of the frame because light is reflected off the inner circumferential wall surfaces of the light-reflective frame. The light-emitting device thus provides an enhanced illuminance on the front of an automobile and is deemed to be suitable for a headlight.

Also, it is required to prevent a vehicle headlight in low beam mode from dazzling a driver of an oncoming vehicle by cutting off light at the upper side while ensuring illumination of the road surface. The boundary of the light at the upper side that is cut off in low beam mode is called a cut-off line 210. It is preferable for safety reasons that the cut-off line 210 be clear, that is, that the upper side of the cut-off line 210 not be irradiated with light in low beam mode (FIG. 14). Accordingly, the optical system of a vehicle headlight is designed such that the cut-off line 210 is clear in low beam mode, and a light-emitting device used as a light source for a headlight is also required to have such luminance characteristics that allow for an optical system offering a clear cut-off line 210 can be designed. Specifically, the light-emitting device is required to have, for example, a clear boundary between a light-emitting surface and a light-reflective frame (i.e., covering member) surrounding the periphery of the light-emitting surface, that is, to have such characteristics that the luminance differs sharply between the outer and inner sides of the boundary as shown in FIG. 13. To make the boundary between the light-emitting surface and the covering member surrounding the periphery of the light-emitting surface clear, as schematically shown in FIG. 15, it is effective to provide a large wavelength conversion member 207 to be disposed on light-emitting elements 201, dispose the wavelength conversion member 207 on the light-emitting elements 201 such that the periphery of the wavelength conversion member 207 is located outside the peripheries of the light-emitting surfaces of the light-emitting elements 201, and dispose a covering member on the light-emitting elements 201 such that the wavelength conversion member 207 is surrounded.

However, the light-emitting surface of the light-emitting device inevitably becomes large if a phosphor plate (i.e., wavelength conversion member) is disposed on or above the light-emitting elements such that the periphery of the phosphor plate is located outside the peripheries of the light-emitting surfaces of the light-emitting elements. Thus, there is a problem that the expanded light-emitting surface of the light-emitting device makes the structure of the optical system of a headlight large.

Accordingly, an object of certain embodiments described herein is to provide a light-emitting device that can offer a clear cut-off line using a simple and small optical system when the light-emitting device is used as a light source for a headlight.

SUMMARY

A light-emitting device according to one embodiment of the present invention includes a substrate; at least one light-emitting element on or above the substrate, the at least one light-emitting element having an upper surface serving as a light-emitting surface of the at least one light-emitting element; a plate-shaped light-transmissive member having a lower surface that faces the upper surface of the at least one light-emitting element; and a covering member that covers a lateral surface of the at least one light-emitting element and a lateral surface of the light-transmissive member. The upper surface of the at least one light-emitting element has a rectangular shape so as to have a first lateral side and a second lateral side opposite to each other, and a third lateral side and a fourth lateral side opposite to each other. An upper surface of the light-transmissive member has a rectangular shape having a first lateral side and a second lateral side opposite to each other, and a third lateral side and a fourth lateral side opposite to each other. The light-transmissive member is disposed on or above the at least one light-emitting element such that, in a plan view from above the light-emitting device, the first lateral side of the upper surface of the light-transmissive member is outside the first lateral side of the upper surface of the at least one light-emitting element, and the second lateral side of the upper surface of the light-transmissive member is inside the second lateral side of the upper surface of the at least one light-emitting element.

The light-emitting device according to certain embodiments described herein can offer a clear cut-off line using a simple and small optical system when used as a light source for a headlight.

DETAILED DESCRIPTION OF EMBODIMENTS

The present inventor has carried out earnest examinations to provide a light-emitting device that can offer a clear cut-off line using a simple and small optical system when used as a light source for a headlight. As a result, it has been found that a light-emitting device having a rectangular light-emitting surface can offer a clear cut-off line using a simple optical system when the light-emitting device is used as a light source for a headlight if the luminance differs sharply between the outer and inner sides of one side of the boundary between the light-emitting surface and a covering member surrounding the periphery of the light-emitting surface. That is, if the luminance changes sharply across one side of the boundary of the rectangular light-emitting surface, a clear cut-off line can be provided when the light-emitting device is used as a light source for a headlight even if the luminance changes gradually across the other sides of the boundary. A light-emitting device according to the present embodiment has been made on the basis of the above findings.

The light-emitting device according to the present embodiment that includes a light-transmissive member mounted on or above the light-emitting surface of at least one light-emitting element and a covering member disposed around the light-transmissive member. The light-transmissive member is mounted on or above the light-emitting surface of the light-emitting element such that one side of the light-transmissive member is located outside one side of the light-emitting surface of the light-emitting element so that the luminance differs sharply between the outer and inner sides of the boundary between the above side of the light-transmissive member and the covering member. At least one of the three sides other than the above side of the light-transmissive member is located inside one side of the light-emitting surface of the light-emitting element to reduce the area of the light-emitting surface correspondingly.

The luminance changes gradually between the outer and inner sides of the side (i.e., one side of the light-emitting surface of the light-emitting device) on which the side of the light-transmissive member is located inside the side of the light-emitting surface of the light-emitting element, but the effects on the clearness of the cut-off line are small.

The light-emitting device according to this embodiment is described in detail below, with reference to the drawings.

Figure 1:
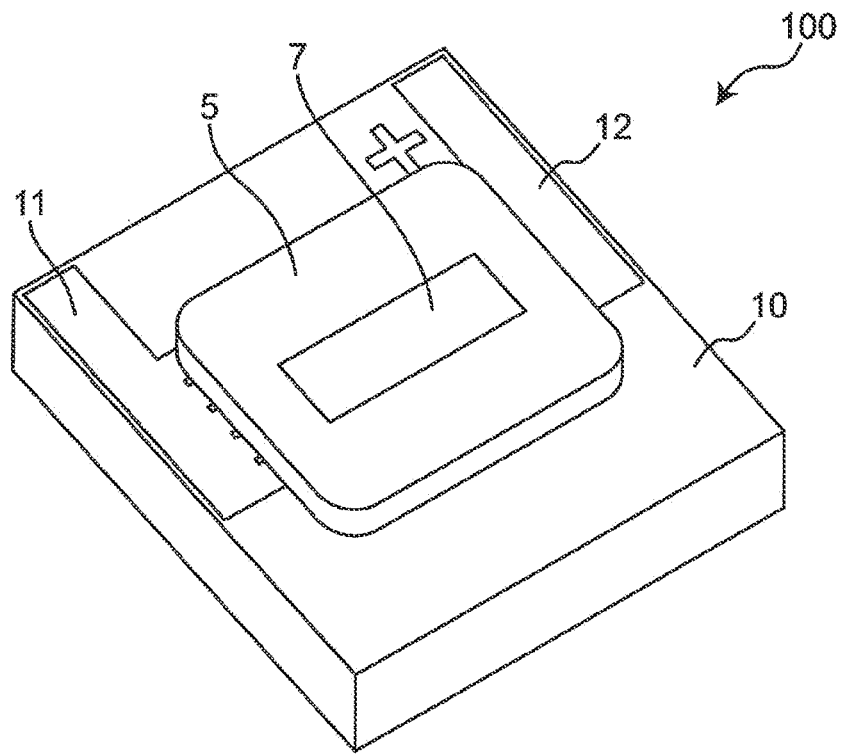
FIG. 1 is a schematic perspective view of a light-emitting device according to an embodiment of the present invention.
Figure 2:
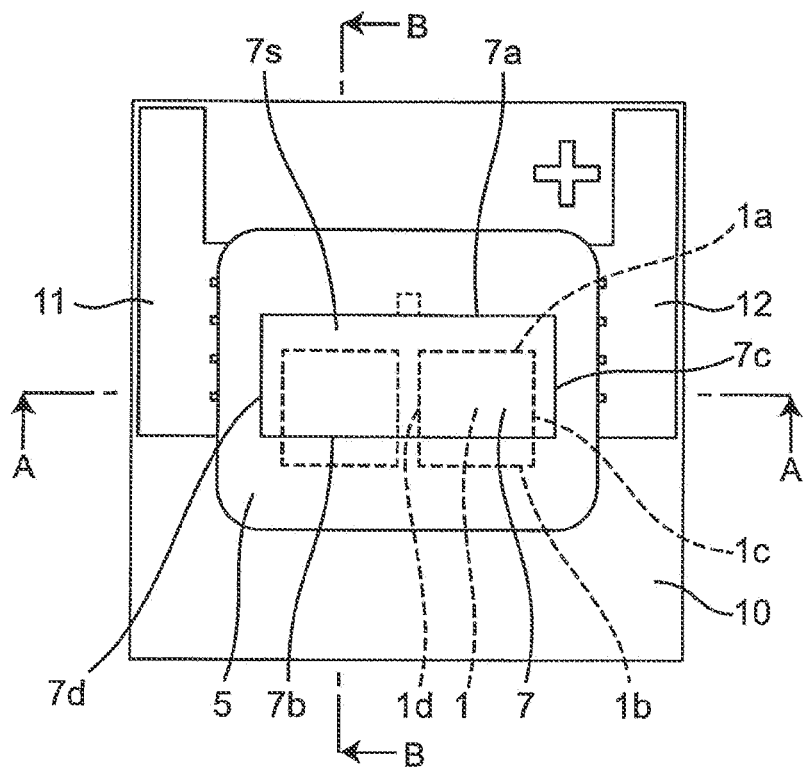
FIG. 2 is a schematic plan view of the light-emitting device according to the embodiment.
Figure 3:
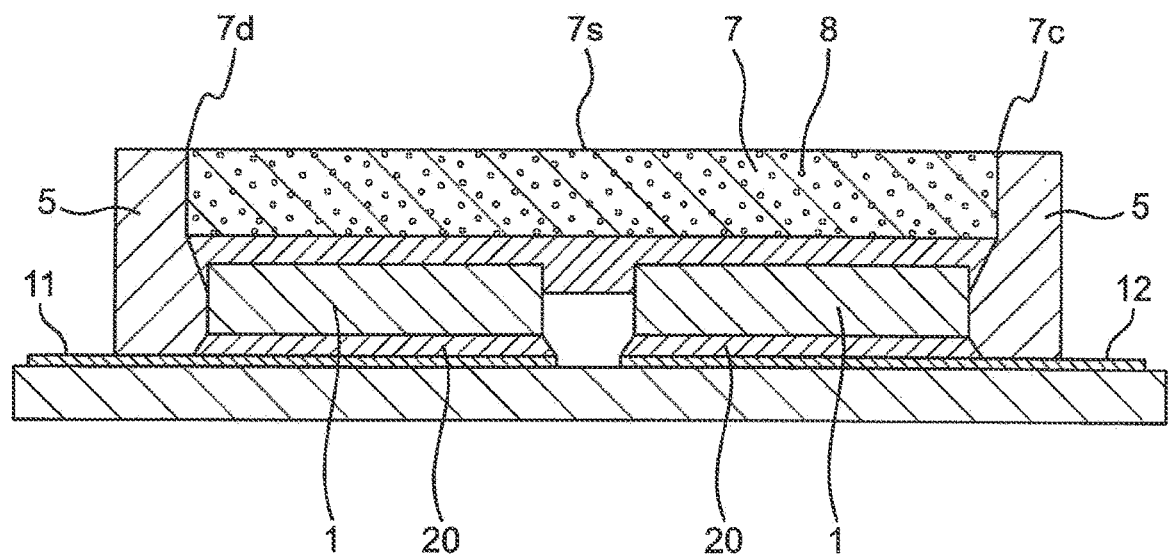
FIG. 3 is a schematic cross-sectional view taken along the line A-A in FIG. 2.
Figure 4:
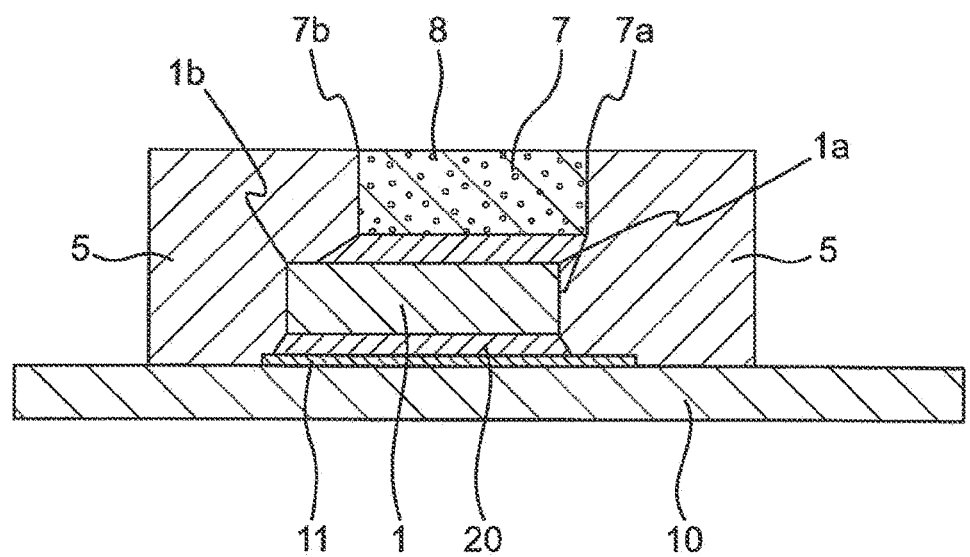
FIG. 4 is a schematic cross-sectional view taken along the line B-B in FIG. 2.

FIG. 1 is a schematic perspective view of the light-emitting device according to one embodiment of the present invention. FIG. 2 is a schematic plan view of the light-emitting device according to the embodiment. FIG. 3 is a schematic cross-sectional view taken along the line A-A in FIG. 2. FIG. 4 is a schematic cross-sectional view taken along the line B-B in FIG. 2.

A light-emitting device 100 according to this embodiment includes
(a) a substrate 10,
(b) light-emitting elements 1 on or above the substrate 10,
(c) a plate-shaped light-transmissive member 7 having a lower surface that faces the upper surfaces serving as the light-emitting surfaces of the light-emitting elements 1, and
(d) a covering member 5 covering lateral surfaces of the light-emitting elements 1 and lateral surfaces of the light-transmissive member 7.

The light-emitting elements 1 are, for example, flip-chip mounted on or above the substrate 10 with electrically-conductive bonding members 20 therebetween as shown in FIG. 3 and FIG. 4. Although the light-emitting elements 1 are simplified in FIG. 3 and FIG. 4, each of the light-emitting elements 1 includes, for example, a p-side electrode and an n-side electrode on the same surface, and the p-side electrode and the n-side electrode are respectively connected to a first electrode 11 and a second electrode 12 disposed on the substrate 10 via the electrically-conductive bonding members 20. As described below in detail, the light-transmissive member 7 is bonded to the light-emitting surfaces of the light-emitting elements 1 with a light-guiding member 40 therebetween. The light-transmissive member 7 contains a phosphor 8 that is excited by light emitted from the light-emitting elements 1 and emits light with a wavelength longer than the wavelength of the light emitted from the light-emitting elements 1.

The covering member 5 is, for example, a reflective member containing a white pigment mixed in a matrix made of resin or the like and covers lateral surfaces of the light-emitting elements 1, lateral surfaces of the light-guiding member 40, and lateral surfaces of the light-transmissive member 7, on the substrate 10. The covering member 5 covers the lateral surfaces to encircle the entire peripheries of the light-emitting elements 1, the light-guiding member 40, and the light-transmissive member 7. An upper surface 7s (in other words, the light-emitting surface of the light-emitting device 100) of the light-transmissive member 7 is substantially flush with the upper surface of the covering member 5. The light-emitting device 100 having the above structure has high upward light extraction efficiency because light laterally emitted from the light-emitting elements 1 and the light-transmissive member 7 is reflected off the covering member 5 and emitted upward.

In particular, in the light-emitting device 100, the light-transmissive member 7 is out of alignment with the light-emitting elements 1 as can be seen from FIG. 2 and FIG. 4. If the light-emitting device 100 having the above structure is used as a light source module for a headlight, a headlight having a clear cut-off line in its light distribution pattern is provided using a simple and small optical system.

<Arrangement of Light-Emitting Elements 1 and Light-Transmissive Member 7>

The upper surfaces of the light-emitting elements 1 each have a rectangular shape having a first lateral side $1a$ and a second lateral side $1b$ that are opposite to each other, and a third lateral side $1c$ and a fourth lateral side $1d$ that are opposite to each other as shown in FIG. 2. The upper surface $7s$ of the light-transmissive member 7 has a rectangular shape having a fifth side $7a$ (i.e., a first lateral side of the upper surface $7s$ of the light-transmissive member) and a sixth side $7b$ (i.e., a second lateral side of the upper surface $7s$ of the light-transmissive member) that are opposite to each other, and a seventh side $7c$ (i.e., a third lateral side of the upper surface $7s$ of the light-transmissive member) and an eighth side $7d$ (i.e., a fourth lateral side of the upper surface $7s$ of the light-transmissive member) that are opposite to each other.

The light-transmissive member 7 is disposed on or above the light-emitting elements 1 such that the fifth side $7a$ is located outside the first sides $1a$ and such that the sixth side $7b$ is located inside the second sides $1b$ in a plan view from above as shown in FIG. 2. The light-emitting device according to this embodiment includes a plurality of light-emitting elements 1 as shown in FIG. 2 and other drawings, and the light-transmissive member 7 is disposed on or above the two light-emitting elements 1 such that the fifth side $7a$ of the light-transmissive member 7 is located outside the first sides $1a$ of the two light-emitting elements 1 and such that the sixth side $7b$ is located inside the second sides $1b$ of the two light-emitting elements 1 as shown in FIG. 2.

In the case where the light-emitting device 100 according to the present embodiment includes a plurality of light-emitting elements 1 each having the first to fourth sides $1a$ to $1d$, it is preferable that the first sides $1a$ of the light-emitting elements 1 lie on the same straight line (first straight line). In addition, it is more preferable to arrange the light-emitting elements 1 on or above the substrate 10 such that the first sides $1a$ lie on the first straight line and such that the second sides $1b$ lie on a second straight line parallel to the first straight line.

In addition, it is preferable that the upper surface $7s$ of the light-transmissive member 7 be substantially flat and substantially parallel to the lower surface of the light-transmissive member 7. Among the lateral surfaces continuous with the upper surface $7s$ of the light-transmissive member 7, the lateral surface continuous with the upper surface $7s$ via the fifth side $7a$ is preferably continuous with the lower surface and substantially perpendicular to the upper surface $7s$.

In the light-emitting device 100 according to the embodiment described above, the light-transmissive member 7 is disposed such that the fifth side $7a$ of the light-transmissive member 7 is located outside the first sides $1a$ of the light-emitting elements 1 in a plan view from above. Hence, the luminance changes abruptly between the outer and inner sides of the boundary corresponding to the fifth side $7a$ of the light-transmissive member 7 between the light-emitting surface and the covering member 5 (left-hand rising edge of the relative luminance in the graph of FIG. 5). A headlight that offers a clear cut-off line using a simple optical system can therefore be provided when the light-emitting device 100 is used as a light source for a headlight.

Figure 5:
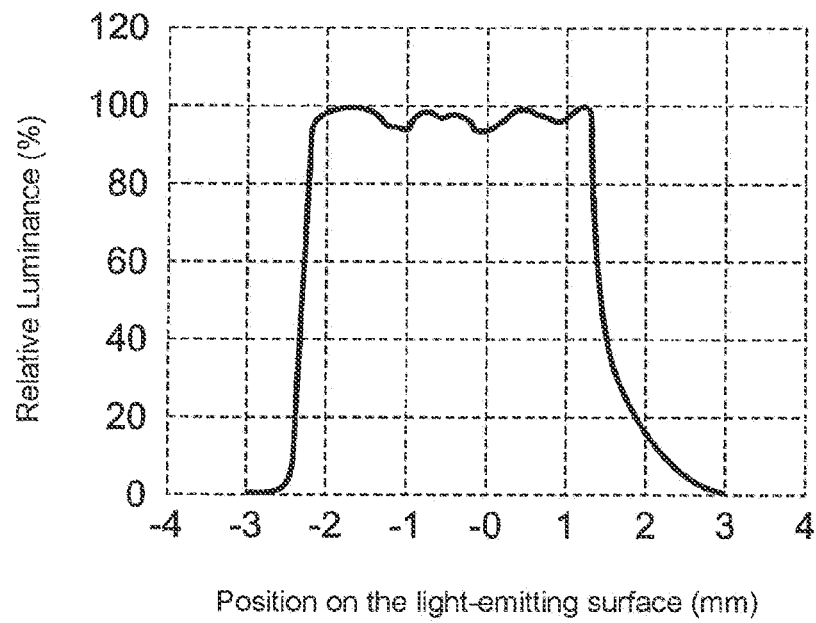
FIG. 5 is a graph showing relative luminance on the light-emitting surface of the light-emitting device according to the embodiment.

Because the light-transmissive member 7 is disposed on or above the light-emitting elements 1 such that the sixth side $7b$ of the light-transmissive member 7 is located inside the second sides $1b$ of the light-emitting elements 1 in a plan view from above in the light-emitting device 100 according to this embodiment, the width of the upper surface $7s$ of the light-transmissive member 7 is narrowed down; in other words, the width of the light-emitting surface of the light-emitting device 100 is narrowed down. In short, the area of the light-emitting surface is reduced. Accordingly, the optical system can be miniaturized when the light-emitting device 100 is used as a light source for a headlight. If the light-transmissive member 7 is disposed on or above the light-emitting elements 1 such that the sixth side $7b$ of the light-transmissive member 7 is located inside the second sides $1b$ of the light-emitting elements 1, the luminance changes gradually between the outer and inner sides of the boundary corresponding to the sixth side $7b$ of the light-transmissive member 7 between the light-emitting surface and the covering member 5 (right-hand rising edge of the relative luminance in the graph of FIG. 5). However, because the light-transmissive member 7 is disposed such that the fifth side $7a$ of the light-transmissive member 7 is located outside the first sides $1a$ of the light-emitting elements 1 in a plan view from above in the light-emitting device 100 according to this embodiment, the structure in which the sixth side $7b$ of the light-transmissive member 7 is located inside the second sides $1b$ of the light-emitting elements 1 has small effects on the clearness of the cut-off line. The graph of the relative luminance of FIG. 5 shows an example of the relative luminance in the cross section taken along the line B-B in FIG. 2.

As described above, if the light-emitting device 100 according to this embodiment is used as a light source for a headlight, a headlight that offers a clear cut-off line using a simple and small optical system can be made.

In the embodiment of the light-emitting device described above, the light-transmissive member 7 is disposed such that the seventh side $7c$ and the eighth side $7d$ of the light-transmissive member 7 are respectively located outside the third side $1c$ and the fourth side $1d$ of the light-emitting elements 1. The luminance therefore changes abruptly between the outer and inner sides of the seventh side $7c$ and the eighth side $7d$, so that a headlight that offers a clear cut-off line using a simpler optical system can be provided when the light-emitting device 100 is used as a light source for a headlight.

In the light-emitting device according to this embodiment, the light-transmissive member 7 may be disposed on or above the light-emitting elements 1 such that the seventh side $7c$ and the eighth side $7d$ are respectively located inside the third side $1c$ and the fourth side $1d$. This structure further reduces the area of the light-emitting surface of the light-emitting device 100, and the optical system can be further miniaturized when the light-emitting device 100 is used as a light source for a headlight.

In the light-emitting device according to this embodiment, the light-transmissive member 7 may be disposed on or above the light-emitting elements such that the seventh side $7c$ is located inside the third side $1c$ and such that the eighth side $7d$ is located outside the fourth side $1d$.

In the light-emitting device according to the above embodiment, one light-transmissive member 7 covers a plurality of light-emitting elements 1.

However, the light-emitting device according to this embodiment is not exclusively limited to this structure, and one light-transmissive member 7 may cover one light-emitting element 1. Alternatively, a plurality of light-transmissive members 7 each covering one or two or more light-emitting elements 1 may be disposed as in modifications described later.

In the light-emitting device according to the above embodiment, the light-transmissive member 7 is disposed on or above the light-emitting elements 1 such that the fifth side 7a is located outside the first sides 1a and such that the sixth side 7b is located inside the second sides 1b in a plan view from above.

However, the light-emitting device according to this embodiment is not exclusively limited to this structure, and the light-transmissive member 7 may be disposed on or above the light-emitting elements 1 such that the fifth side 7a overlaps the first sides 1a and such that the sixth side 7b is located inside the second sides 1b in a plan view from above.

The light-emitting device according to the above embodiment includes the light-transmissive member 7 containing the phosphor 8.

However, the light-emitting device according to this embodiment is not limited to this structure, and a light-transmissive member 7 containing no phosphor may be included.

First Modification

Figure 6:
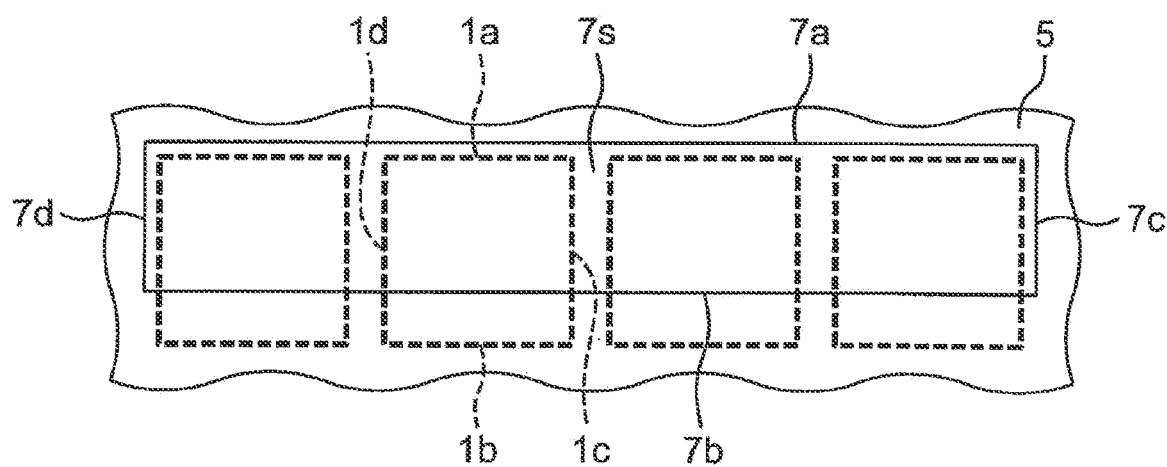
FIG. 6 is a schematic plan view of a light-emitting device according to a first modification.

FIG. 6 is a schematic plan view of a light-emitting device according to a first modification.

The light-emitting device according to the first modification is substantially the same as the light-emitting device according to this embodiment shown in FIG. 2 and other drawings except that four light-emitting elements 1 are used.

The light-emitting device according to the first modification having the above structure has substantially the same effects as the light-emitting device according to this embodiment and can provide higher luminance than the luminance of the light-emitting device shown in FIG. 2 and other drawings.

Second Modification

Figure 7:
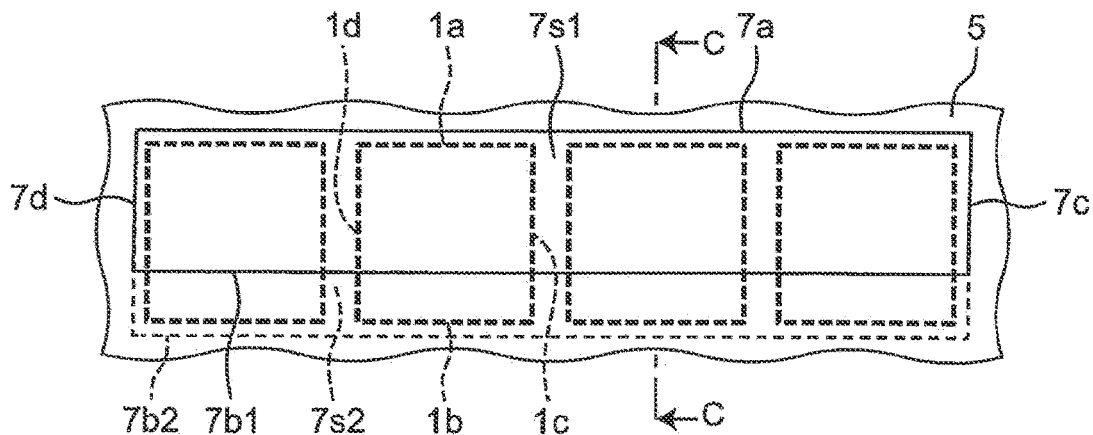
FIG. 7 is a schematic plan view of a light-emitting device according to a second modification.
Figure 8:
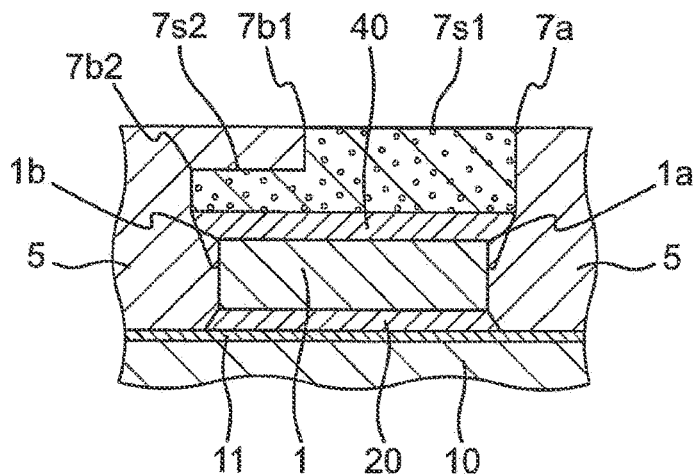
FIG. 8 is a schematic cross-sectional view taken along the line C-C in FIG. 7.

FIG. 7 is a schematic plan view of a light-emitting device according to a second modification. FIG. 8 is a schematic cross-sectional view of the light-emitting device according to the second modification taken along the line C-C in FIG. 7.

The light-emitting device according to the second modification is substantially the same as the light-emitting device according to the first modification except that the shape of the light-transmissive member 7 differs from the shape in the light-emitting device according to the first modification. In the light-emitting device according to the second modification, the light-transmissive member 7 has a second upper surface located outside and below the upper surface 7s (hereinafter referred to as a first upper surface) of the light-transmissive member 7 in the second modification, and the second upper surface is covered with the covering member 5. The following specifically describes differences from the embodiment described above and the first modification.

In the light-emitting device according to the second modification, the light-transmissive member 7 has the lower surface bonded to the light-emitting elements 1 and the upper surfaces opposite to the lower surface. A substantially flat lower surface constitutes the lower surface of the light-transmissive member 7, and the upper surfaces include at least two upper surfaces: a first upper surface 7s1 and a second upper surface 7s2. There is a difference in level between the first upper surface 7s1 and the second upper surface 7s2. Specifically, the thickness of the light-transmissive member 7 between the second upper surface 7s2 and the lower surface thereof is smaller than the thickness of the light-transmissive member 7 between the first upper surface 7s1 and the lower surface thereof.

In the light-emitting device according to the second modification, the first upper surface 7s1 of the light-transmissive member 7 has the fifth side 7a and a sixth internal side 7b1 opposite to the fifth side 7a. The second upper surface 7s2 of the light-transmissive member 7 has a sixth external side 7b2 located outside the sixth internal side 7b1. In other words, the light-transmissive member 7 has the second upper surface 7s2 located outside the sixth internal side 7b1 in a plan view from above.

In the light-emitting device according to the second modification, the light-transmissive member 7 is disposed on or above the light-emitting elements 1 such that (a) the fifth side 7a is located outside the first sides 1a of the light-emitting elements 1, (b) the sixth internal side 7b1 is located inside the second sides 1b of the light-emitting elements 1, and (c) the sixth external side 7b2 is located outside the second sides 1b of the light-emitting elements 1 in a plan view from above as shown in FIG. 7 and FIG. 8.

In this case, the first upper surface 7s1 of the light-transmissive member 7 is preferably a substantially flat surface substantially parallel to the lower surface, and among the lateral surfaces continuous with the first upper surface 7s1 of the light-transmissive member 7, at least the lateral surface continuous with the first upper surface 7s1 via the fifth side 7a is preferably continuous with the lower surface and substantially perpendicular to the first upper surface 7s1. The second upper surface 7s2 may be substantially parallel to the lower surface or may be inclined relative to the lower surface.

In the light-emitting device according to the second modification, the covering member 5 covers the second upper surface 7s2 such that the first upper surface 7s1 is exposed. With this structure, the first upper surface 7s1 of the light-transmissive member 7 serves as the light-emitting surface of the light-emitting device.

In the light-emitting device according to the second modification having the above structure, the light-transmissive member 7 is disposed such that the fifth side 7a of the light-transmissive member 7 is located outside the first sides 1a of the light-emitting elements 1 in a plan view from above. Hence, the luminance changes abruptly between the outer and inner sides of the boundary corresponding to the fifth side 7a of the light-transmissive member 7 between the light-emitting surface and the covering member 5. A headlight that offers a clear cut-off line using a simple optical system can therefore be provided when the light-emitting device according to the second modification is used as a light source for a headlight.

Because the light-transmissive member 7 is disposed on or above the light-emitting elements 1 such that the sixth internal side 7b1 of the light-transmissive member 7 is located inside the second sides 1b of the light-emitting elements 1 in a plan view from above in the light-emitting device according to the second modification, the width of the first upper surface 7s1 of the light-transmissive member 7 is narrowed down; in other words, the width of the light-emitting surface of the light-emitting device is narrowed down, thereby reducing the area of the light-emitting surface. Accordingly, the optical system can be miniaturized when the light-emitting device 100 is used as a light source for a headlight.

In the case where the light-transmissive member 7 in the light-emitting device according to the second modification contains a phosphor; in other words, in the case where a desired emission color of the light-emitting device is obtained because the emitted light contains light having undergone wavelength conversion by the phosphor, the lower surface of the light-transmissive member 7 covering the entire light-emitting surfaces of the light-emitting elements 1 prevents light emitted from the light-emitting elements from bypassing the light-transmissive member 7 and leaking out.

Third Modification

Figure 9:
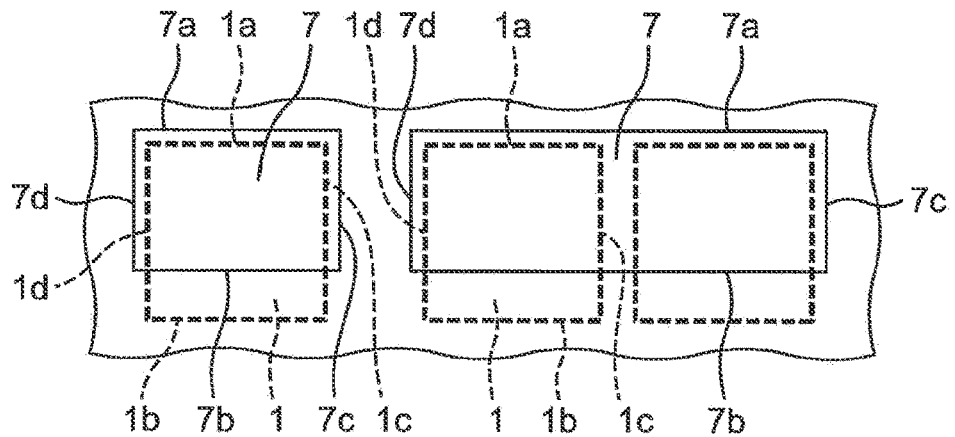
FIG. 9 is a schematic plan view of a light-emitting device according to a third modification.

FIG. 9 is a schematic plan view of a light-emitting device according to a third modification.

The light-emitting device according to the third modification differs from the light-emitting device according to the embodiment described above in that three light-emitting elements 1 and two light-transmissive members 7 are included.

In the light-emitting device according to the third modification, one light-transmissive member 7 is disposed on or above two light-emitting elements 1, and the other light-transmissive member 7 is disposed on or above one light-emitting element 1. Specifically, one of the two light-transmissive members 7 is disposed over two light-emitting elements 1 such that the fifth side $7a$ is located outside the first sides $1a$ of the two light-emitting elements 1 and such that the sixth side $7b$ is located inside the second sides $1b$ of the two light-emitting elements 1 in a plan view from above as shown in FIG. 9.

The other one of the two light-transmissive members 7 is disposed on or above the other light-emitting element 1 such that the fifth side $7a$ is located outside the first side $1a$ of the light-emitting element 1 and such that the sixth side $7b$ is located inside the second side $1b$ of the light-emitting element 1 in a plan view from above as shown in FIG. 9.

In the above case where the light-emitting device includes a plurality of light-emitting elements 1, combinations of the numbers, intervals, and densities of the light-transmissive members 7 and the light-emitting elements 1 can be selected to provide a light source suitable for a desired light distribution pattern.

In the light-emitting device according to the third modification, the two light-transmissive members 7 are disposed such that the seventh sides $7c$ and the eighth sides $7d$ of the light-transmissive members 7 are respectively located outside the third sides $1c$ and the fourth sides $1d$ of the light-emitting elements 1.

With the light-emitting device according to the third modification having the above structure, a headlight that offers a clear cut-off line in the light distribution pattern using a simpler optical system can be provided when the light-emitting device 100 is used as a light source for a headlight.

Because the light-emitting device according to the third modification can have a more reduced area of the light-emitting surface, the optical system can be further miniaturized when the light-emitting device according to the third modification is used as a light source for a headlight.

Fourth Modification

Figure 10:
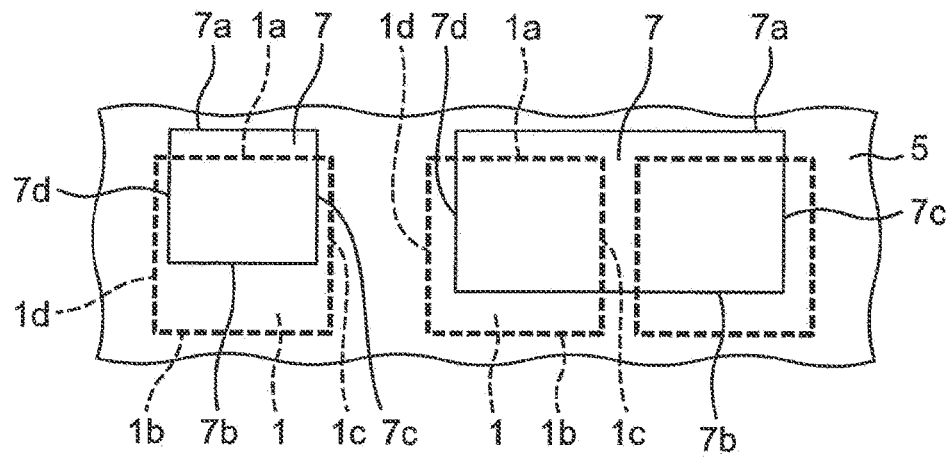
FIG. 10 is a schematic plan view of a light-emitting device according to a fourth modification.

FIG. 10 is a schematic plan view of a light-emitting device according to a fourth modification.

The light-emitting device according to the fourth modification is substantially the same as the light-emitting device according to the third modification except that the two light-transmissive members 7 in the light-emitting device according to the third modification are changed such that the seventh sides $7c$ and the eighth sides $7d$ of the light-transmissive members 7 are respectively located inside the third sides $1c$ and the fourth sides $1d$ of the light-emitting elements 1.

Because the area of the light-emitting surface of the light-emitting device according to the fourth modification having the above structure can be smaller than in the light-emitting device according to the third modification, the optical system can be further miniaturized when the light-emitting device according to the fourth modification is used as a light source for a headlight.

Fifth Modification

Figure 11:
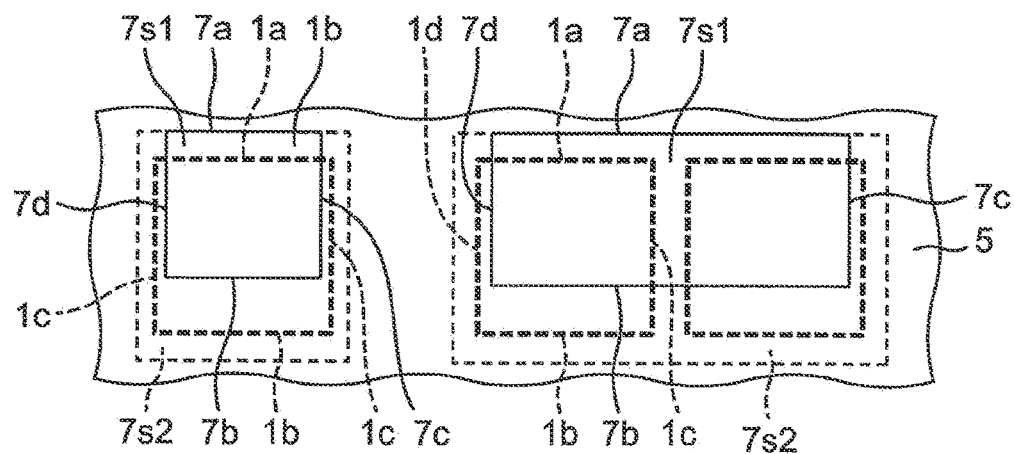
FIG. 11 is a schematic plan view of a light-emitting device according to a fifth modification.

FIG. 11 is a schematic plan view of a light-emitting device according to a fifth modification.

The light-emitting device according to the fifth modification is substantially the same as the light-emitting device according to the fourth modification except that the shapes of the two light-transmissive members 7 differ from the shapes in the light-emitting device according to the fourth modification.

Specifically, in the light-emitting device according to the fifth modification, the light-transmissive members 7 each have the second upper surface $7s2$ located outside and below the upper surface (first upper surface $7s1$) of the light-transmissive members 7 in the fourth modification, and the second upper surface $7s2$ is covered with the covering member 5. The second upper surface $7s2$ of each light-transmissive member 7 in the light-emitting device according to the fifth modification is disposed on the three sides other than the fifth side $7a$ in a plan view from above. In the light-emitting device according to the fifth modification, the light-transmissive members 7 have substantially flat lower surfaces bonded to the light-emitting elements 1.

In the light-emitting device according to the fifth modification, the positional relation between the first upper surfaces $7s1$ of the light-transmissive members 7 and the light-emitting elements 1 is substantially the same as the positional relation between the upper surfaces $7s$ of the light-transmissive members 7 and the light-emitting elements 1 in the light-emitting device according to the fourth modification in a plan view from above. The light-transmissive members 7 are disposed on or above the light-emitting elements 1 such that their lower surfaces are located outside the peripheries of the corresponding light-emitting elements 1.

A headlight that offers a clear cut-off line using a simpler optical system can be provided when the light-emitting device according to the fifth modification having the above structure is used as a light source for a headlight.

Because the light-emitting device according to the fifth modification can have a reduced area of the light-emitting surface, a light-emitting device with a high luminance can be provided. In addition, the optical system can be further miniaturized when the light-emitting device is used as a light source for a headlight.

The light-emitting device according to the fifth modification having the above structure has substantially the same effects as the light-emitting device according to the fourth modification. Furthermore, in the case where the light-transmissive members 7 contain a phosphor, the phosphor 8 can be efficiently irradiated with light emitted from the light-emitting elements 1 because the light-transmissive members 7 cover the entire light-emitting surfaces of the light-emitting elements 1.

Sixth Modification

Figure 12:
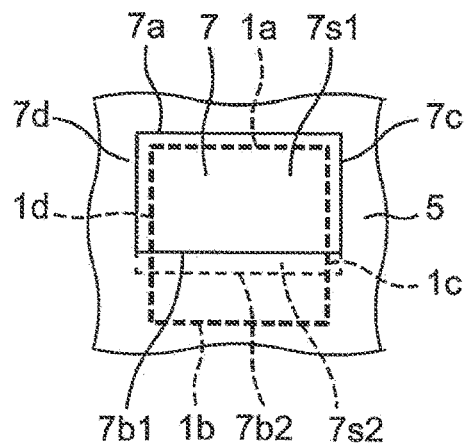
FIG. 12 is a schematic plan view of a light-emitting device according to a sixth modification.
Figure 13:
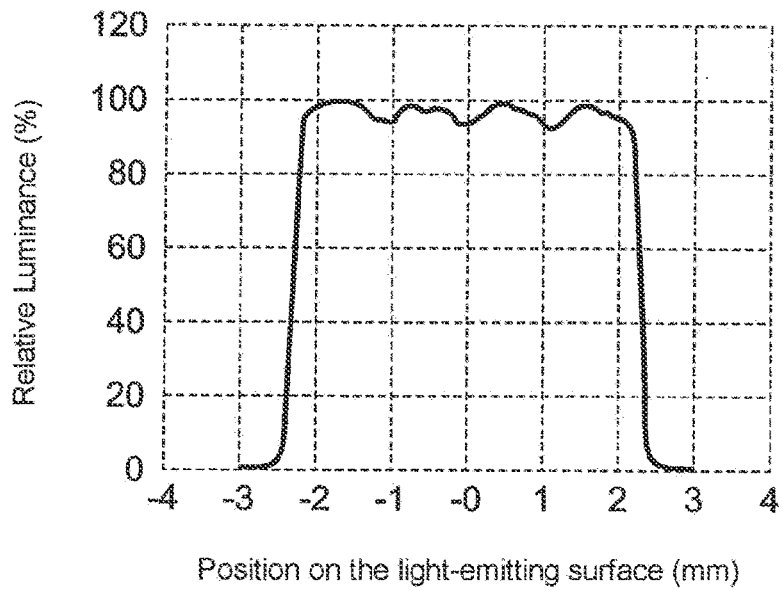
FIG. 13 is a graph showing relative luminance on the light-emitting surface of a conventional light-emitting device.
Figure 14:
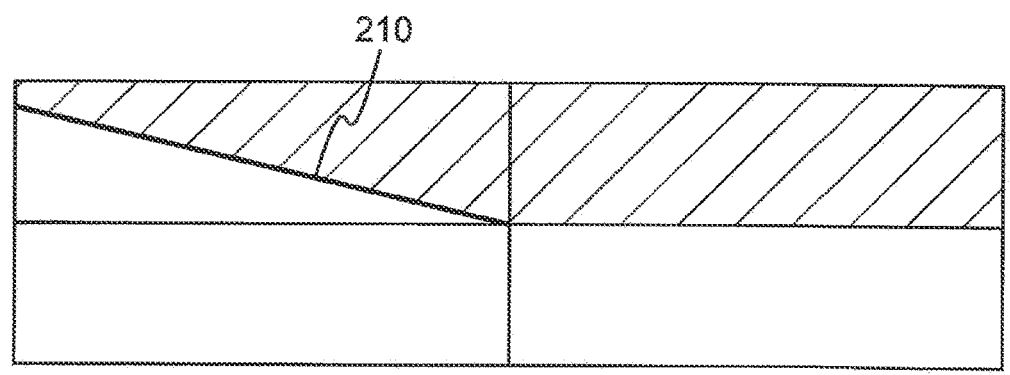
FIG. 14 is a graph showing irradiation characteristics of a headlight in low beam mode.
Figure 15:
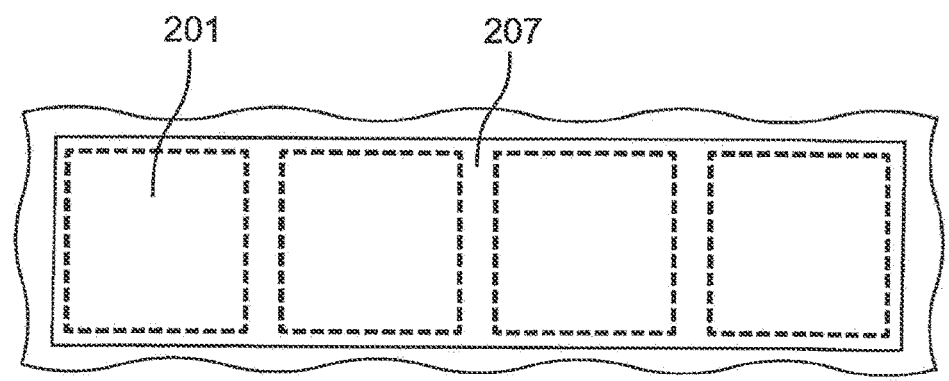
FIG. 15 is a schematic plan view of an illustrative conventional light-emitting device.

FIG. 12 is a schematic plan view of a light-emitting device according to a sixth modification.

In the light-emitting device according to the sixth modification, the light-transmissive member 7 has the second upper surface 7s2 located outside and below the upper surface 7s1, and the second upper surface 7s2 is covered with the covering member 5. The light-transmissive member 7 is disposed on or above the light-emitting element 1 such that the fifth side 7a is located outside the first side 1a of the light-emitting element 1 and such that the sixth internal side 7b1 and the sixth external side 7b2 are both located inside the second side 1b of the light-emitting element 1 in a plan view from above as shown in FIG. 12. In the light-emitting device according to the sixth modification, the seventh side 7c and the eighth side 7d of the light-transmissive member 7 are located outside the third side 1c and the fourth side 1d of the light-emitting element 1.

A headlight that offers a clear cut-off line using a simpler optical system can be provided when the light-emitting device according to the sixth modification having the above structure is used as a light source for a headlight.

Because the light-emitting device according to the sixth modification can have a more reduced area of the light-emitting surface, the optical system can be further miniaturized when the light-emitting device is used as a light source for a headlight.

The following describes the members and structure of each of the light-emitting devices according to the present embodiment and modifications.

(Substrate 10)

The substrate 10 is a member on or above which the light-emitting element is arranged, and includes wiring that electrically connects the electrodes of the light-emitting element and external electrodes. A preferable main material for the substrate 10 is an insulating material that transmits less extraneous light and less light emitted from the light-emitting element. Examples of the material include ceramics, such as alumina and aluminum nitride, and resins, such as phenolic resins, epoxy resins, polyimide resins, bismaleimide triazine resins, and polyphthalamide. In the case where a resin is used, an inorganic filler, such as glass fiber, silicon oxide, titanium oxide, and alumina, may be mixed with the resin as appropriate. Such a filler can improve the mechanical strength, reduce the thermal expansion coefficient, and improve the light reflectance. The substrate 10 may be a metal member on the surface of which an insulating material is formed. The wiring is formed into a predetermined pattern on the insulating material. The material for the wiring can be at least one selected from gold, silver, copper, and aluminum. The wiring can be formed by plating, vapor evaporation, sputtering, or the like.

(Light-Emitting Element 1)

A light emitting diode is preferably used as the light-emitting element 1. The light-emitting element can be appropriately selected to exhibit an appropriate emission wavelength. Examples of a blue or green light-emitting element include a light-emitting element that includes ZnSe, a nitride semiconductor ($In_XAl_YGa_{1-X-Y}N$, where $0 \leq X$, $0 \leq Y$, and $X+Y \leq 1$) or GaP. For a red light-emitting element, GaAlAs, AlInGaP, or the like can be used. Semiconductor light-emitting elements made of other materials can also be used. The compositions, emission colors, sizes, and number of the light-emitting elements to be used can be selected appropriately depending on the purpose. In the case where the light-emitting device contains a phosphor, for example, a nitride semiconductor ($In_XAl_YGa_{1-X-Y}N$, where $0 \leq X$, $0 \leq Y$, and $X+Y \leq 1$) is suitable because it can emit light with short wavelengths that can efficiently excite the phosphor. The emission wavelength can be selected by changing the materials for the semiconductor layers and their mixing ratios.

The light-emitting element in this embodiment includes positive and negative electrodes on the same surface and is flip-chip mounted on or above the substrate by bonding the positive and negative electrodes to the substrate using electrically-conductive bonding members. The upper surface of the light-emitting element opposite to the lower surface on which the electrodes are formed serves as the main emission surface. Because such a light-emitting element is connected to the substrate using electrically-conductive bonding members, such as bumps and electrically-conductive pastes, the area of contact between the electrodes and the substrate can be larger than in the case of a light-emitting element that is connected using metal wires or the like, and the contact resistance can be reduced.

The light-emitting element is formed by, for example, layering a nitride semiconductor layer on a light-transmissive sapphire growth substrate. The sapphire substrate is located at the upper surface of the light-emitting element 1 and constitutes the main emission surface. The growth substrate may be removed by, for example, abrasion or laser lift off (LLO).

(Light-Transmissive Member 7)

The light-transmissive member 7 can transmit light emitted from the light-emitting element 1 and allows the light to exit to the outside. The light-transmissive member 7 may contain a light-diffusing material and a phosphor that can perform wavelength conversion of at least part of incident light. The light-transmissive member 7 can be made of, for example, resin, glass, or an inorganic substance. Examples of the light-transmissive member containing a phosphor include sintered bodies of phosphors, and mixtures of phosphors and substances such as resin, glass, ceramics, and other inorganic substances. Alternatively, a mold or compact of resin, glass, or a ceramic on the surface of which a resin layer containing a phosphor is formed can be used. The thickness of the light-transmissive member 7 is, for example, about 50 μm to 300 μm.

The light-transmissive member 7 can be bonded to the light-emitting element using, for example, the light-guiding member described later. The light-transmissive member can be directly bonded to the light-emitting element by compression, sintering, surface-activated bonding, atomic diffusion bonding, or hydroxy-group bonding.

(Phosphor)

For the phosphor that can be contained in the light-transmissive member 7, a phosphor that can be excited by light emitted from the light-emitting element is used. Examples of a phosphor that can be excited by a blue or ultraviolet light-emitting element include cerium-activated yttrium-aluminum-garnet phosphors (Ce:YAG); cerium-activated lutetium-aluminum-garnet phosphors (Ce:LAG); europium- and/or chromium-activated nitrogen-containing calcium aluminosilicate phosphors ($CaO-Al_2O_3-SiO_2$); europium-activated silicate phosphors (($Sr,Ba)_2SiO_4$); nitride phosphors such as β-SiAlON phosphors, CASN phosphors, and SCASN phosphors; KSF phosphors ($K_2SiF_6$:Mn); sulfide phosphors; and quantum-dot phosphors. Combinations of such phosphors and blue or ultraviolet light-emitting elements enable light-emitting devices emitting various colors (such as white light-emitting devices) to be manufactured.

(Covering Member 5)

The covering member 5 covers the lateral surfaces of the light-emitting element 1 and the light-transmissive member 7. The covering member 5 can be formed using, for example, a light-reflective material having a high light reflectance. Specifically, a light-reflective material having a reflectance of light emitted from the light-emitting element of 60% or more, more preferably 80% or 90% or more can be used for the covering member 5. The light-reflective material includes, for example, a resin material containing a light-reflective substance.

Examples of the resin serving as the matrix constituting the covering member 5 include silicone resins, modified silicone resins, epoxy resins, modified epoxy resins, acrylic resins, and hybrid resins each containing at least one of these resins. The covering member 5 can be formed by mixing a reflective substance in the resin matrix. Examples of the light-reflective substance include oxides containing any of Ti, Zr, Nb, Al, and Si; AN; and MgF. Titanium dioxide (TiO2) is preferable. It is preferable that particles having a refractive index different from the refractive index of the matrix resin be dispersed as the light-reflective substance in the matrix resin. Because the amounts of reflection and transmission of light vary depending on the concentration and density of the light-reflective substance, the concentration and density can be appropriately adjusted depending on the shape and size of the light-emitting device.

(Light-Guiding Member 40)

The light-emitting device may include the light-guiding member 40 that covers at least a portion of the lateral surfaces of the light-emitting element 1. In the case where part of the upper surface of the light-emitting element 1 is exposed out of the light-transmissive member 7, the light-guiding member 40 preferably covers the part of the upper surface of the light-emitting element exposed out of the light-transmissive member 7. In addition, the light-guiding member 40 preferably covers the part of the lower surface of the light-transmissive member 7 exposed out of the light-emitting element 1. The light-guiding member 40 may be disposed also between the light-emitting element and the light-transmissive member 7 to function as an adhesive member for bonding the light-emitting element to the light-transmissive member 7. If this light-guiding member 40 is included, the outer surfaces of the light-guiding member 40 reflect light emitted from the upper and lateral surfaces of the light-emitting element 1 to guide the reflected light to the light-transmissive member 7.

The light-guiding member 40 is preferably made of a resin material because resin materials are easy to handle and process. A resin material made of a resin or hybrid resin containing at least one of silicone resins, modified silicone resins, epoxy resins, modified epoxy resins, acrylic resins, and fluorocarbon resins can be used. The light-guiding member 40 can be formed by utilizing the viscosity of the resin material for the light-guiding member 40 and the wettability of the light-emitting element 1 by the resin material.

The light-emitting device may optionally include other elements and electronic components such as a protective element. These elements and electronic components are preferably embedded in the covering member 5.

What is claimed is:

1. A light-emitting device comprising:
   a substrate having an upper surface;
   at least one light-emitting element on or above the substrate, the at least one light-emitting element having a rectangular shape in a plan view from above the light-emitting device and having an upper surface serving as a light-emitting surface of the at least one light-emitting element;
   a plate-shaped light-transmissive member having a rectangular shape in a plan view from above the light-emitting device and having a lower surface that faces the upper surface of the at least one light-emitting element; and
   a light-guiding member that is disposed between the light-emitting element and the light-transmissive member,
   wherein the upper surface of the at least one light-emitting element with the rectangular shape has a first lateral side and a second lateral side opposite to each other, and a third lateral side and a fourth lateral side opposite to each other,
   wherein an upper surface of the light-transmissive member with the rectangular shape has a first lateral side and a second lateral side opposite to each other, and a third lateral side and a fourth lateral side opposite to each other,
   wherein the light-transmissive member is disposed on or above the at least one light-emitting element such that, in a plan view from above the light-emitting device, the first lateral side of the upper surface of the light-transmissive member is outside the first lateral side of the upper surface of the at least one light-emitting element, and the second lateral side of the upper surface of the light-transmissive member is inside the second lateral side of the upper surface of the at least one light-emitting element,
   wherein the light-guiding member has a first side surface which connects a first lateral side of the lower surface of the light-transmissive member which is opposite to the first lateral side of the upper surface of the light-transmissive member with the at least one light-emitting element; and a second side surface which connects a second lateral side of the lower surface of the light-transmissive member which is opposite to the second lateral side of the upper surface of the light-transmissive member with the at least one light-emitting element, and
   wherein an inclined angle of the first side surface of the light-guiding member with respect to the upper surface of the substrate is greater than an inclined angle of the second side surface of the light-guiding member with respect to the upper surface of the substrate.

2. The light-emitting device according to claim 1, wherein no light-emitting element in the light emitting device overlaps the first lateral side of the upper surface of the light-transmissive member.

3. The light-emitting device according to claim 1, wherein the light-transmissive member covers the plurality of light-emitting elements.

4. The light-emitting device according to claim 1, wherein the light-transmissive member comprises a phosphor.

5. The light-emitting device according to claim 1, wherein a covering member that covers a lateral surface of the at least one light-emitting element and a lateral surface of the light-transmissive member.

6. The light-emitting device according to claim 5, wherein a distance between the first lateral side of the light-transmissive member and a lateral surface of the covering member is the same as a distance between the second lateral side of the light-transmissive member and a lateral surface of the covering member.

7. The light-emitting device according to claim 5, wherein a distance between the first lateral side of the at least one light-emitting element and a lateral surface of the covering member is larger than a distance between the second lateral side of the at least one light-emitting element and a lateral surface of the covering member.

8. The light-emitting device according to claim 5, wherein a portion of the upper surface of the at least one light-emitting element does not overlap the light-guiding member, and the portion of the upper surface of the at least one light-emitting element and the second side surface of the light-guiding member is covered with the covering member.

* * * * *